United States Patent
Yang et al.

(10) Patent No.: US 8,901,631 B2
(45) Date of Patent: Dec. 2, 2014

(54) VERTICAL TRANSISTOR IN SEMICONDUCTOR DEVICE AND METHOD FOR FABRICATING THE SAME

(71) Applicants: Sheng-Wei Yang, Taoyuan County (TW); Ying-Cheng Chuang, Taoyuan County (TW); Shyam Surthi, Boise, ID (US)

(72) Inventors: Sheng-Wei Yang, Taoyuan County (TW); Ying-Cheng Chuang, Taoyuan County (TW); Shyam Surthi, Boise, ID (US)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/792,231

(22) Filed: Mar. 11, 2013

(65) Prior Publication Data

US 2014/0252532 A1    Sep. 11, 2014

(51) Int. Cl.
*H01L 29/94*  (2006.01)
*H01L 29/06*  (2006.01)
*H01L 21/765* (2006.01)

(52) U.S. Cl.
CPC .......... *H01L 29/0607* (2013.01); *H01L 21/765* (2013.01)
USPC ............. 257/302; 257/60; 257/623; 257/659; 257/E21.41; 257/328; 257/329

(58) Field of Classification Search
USPC .................. 257/60, 302, 623, 659, 328, 329, 257/E21.41
See application file for complete search history.

(56) References Cited

U.S. PATENT DOCUMENTS

| | | | |
|---|---|---|---|
| 2011/0020992 A1* | 1/2011 | Purayath et al. | 438/259 |
| 2011/0220994 A1* | 9/2011 | Parekh et al. | 257/334 |
| 2012/0299088 A1* | 11/2012 | Heineck et al. | 257/329 |
| 2013/0187220 A1* | 7/2013 | Surthi | 257/329 |
| 2013/0187279 A1* | 7/2013 | Surthi et al. | 257/773 |

* cited by examiner

*Primary Examiner* — Thanh V Pham
(74) *Attorney, Agent, or Firm* — Jianq Chyun IP Office

(57) ABSTRACT

Provided is a method for fabricating a semiconductor device, including the following steps. A substrate having a plurality of pillars is provided, wherein a plurality of trenches are formed around each pillar. A doped region is formed in the substrate and below each pillar. The doped region below each trench is removed to form an opening such that the doped regions below the adjacent pillars are separated from each other. A shielding layer is formed in each opening.

5 Claims, 3 Drawing Sheets

VERTICAL TRANSISTOR IN SEMICONDUCTOR DEVICE AND METHOD FOR FABRICATING THE SAME

BACKGROUND OF THE INVENTION

1. Field of Invention

The present invention relates to an electronic device and a method for fabricating the same, more particularly, to a semiconductor device and a method for fabricating the same.

2. Description of Related Art

In order to accelerate operating speed of integrated circuit and to meet customers' demands on miniaturizing electronic devices, physical dimensions of transistors in a semiconductor device are continuously reduced. However, as the dimension of the transistor is reduced, its channel length will also decrease with ease leading to problems such as short channel effect and decrease in turn-on current. A conventional solution to said issue is to enhance the dopant concentration in the channel region. Nevertheless, this method causes an increase in a leakage current and therefore affects the reliability of devices.

To resolve said issue, the conventional horizontal transistor structure is recently replaced by a vertical transistor structure in the industry. For example, the vertical transistor structure is formed in a deep trench of the substrate. Hence, the operating speed and integration level of integrated circuits are enhanced and problems such as short channel effect are avoided. However, the coupling effect between the adjacent conductive regions (e.g. heavily doped silicon) becomes more and more serious in the conventional vertical transistor, and the issue such as parasitic capacitance is also arising.

SUMMARY OF THE INVENTION

The present invention is to provide a semiconductor and a method for fabricating the same, which may reduce the coupling effect between the adjacent conductive regions and resolve the problem of parasitic capacitance.

The present invention provides a method for fabricating a semiconductor device, including the following steps. A substrate having a plurality of pillars is provided, wherein a plurality of trenches are formed around each pillar. A doped region is formed in the substrate below each pillar. The doped region below each trench is removed to form an opening such that the doped regions below the adjacent pillars are separated from each other. A shielding layer is formed inside each of the openings.

According to an embodiment of the present invention, the shielding layer includes conductive material.

According to an embodiment of the present invention, the conductive material includes doped epitaxial silicon, doped polysilicon or metal.

According to an embodiment of the present invention, a spacer is formed on the sidewall of each pillar and the sidewall of each doped region before forming the shielding layer, wherein the spacer exposes the surface of the substrate at the bottom of each opening.

According to an embodiment of the present invention, formation of the spacer includes the following steps. A spacer material is formed on the sidewall of each pillar and the sidewall of each doped region. The spacer material is anisotropically etched to form the spacer.

According to an embodiment of the present invention, the spacer exposes the surface of the substrate at the bottom of each opening, and the shielding layer is electrically connected to the substrate.

According to an embodiment of the present invention, formation of the doped region includes the following steps. An ion implantation process is performed to implant dopants into the bottom of each trench. A drive-in process is performed such that the dopants diffuse to a region below each pillar to form the doped region.

According to an embodiment of the present invention, a liner is formed on the sidewall of each pillar before performing the ion implantation process.

According to an embodiment of the present invention, a cap is formed on the top surface of each pillar before performing the ion implantation process.

The present invention provides a semiconductor device including a plurality of pillars, a plurality of doped regions, and a plurality of shielding layers. The pillars are disposed on a substrate, wherein a plurality of trenches are formed around each pillar. Each doped region is disposed in the substrate below each pillar. An opening is disposed between the adjacent pillars such that the doped regions below adjacent pillars separate from each other. Each shielding layer is disposed in each opening.

According to an embodiment of the present invention, the shielding layer includes conductive material.

According to an embodiment of the present invention, the conductive material includes doped epitaxial silicon, doped polysilicon or metal.

According to an embodiment of the present invention, a spacer is disposed on the side wall of each pillar and between the doped region and the shielding layer.

According to an embodiment of the present invention, a liner is disposed between the side wall of each pillar and the spacer.

According to an embodiment of the present invention, the shielding layer is electrically connected to the substrate.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
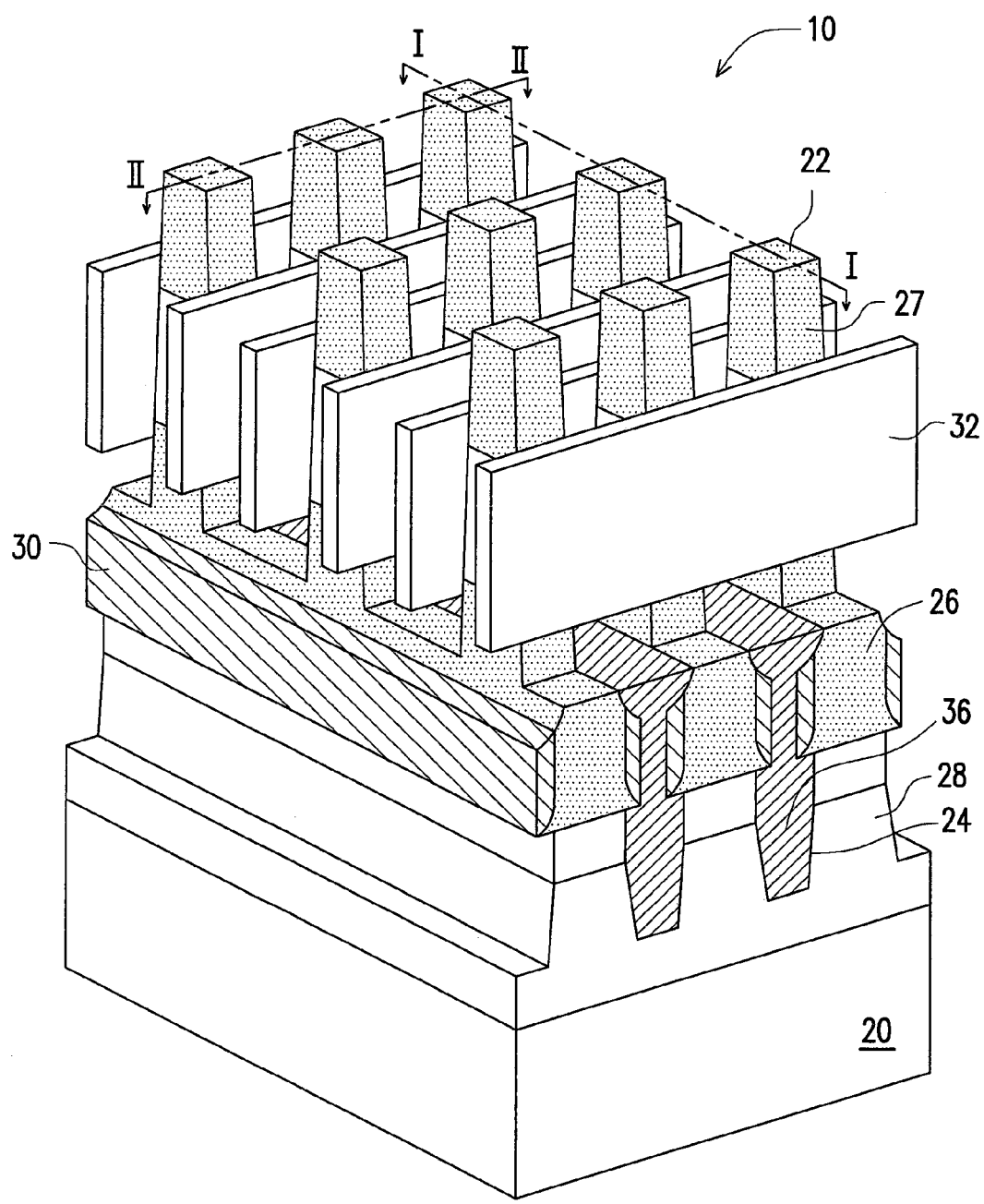
FIG. 1 is a schematic diagram of a semiconductor device according to the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram of a semiconductor device according to the present invention.

Referring to FIG. 1, a semiconductor device 10 fabricated according to the method of present invention includes a substrate 20 having a plurality of pillars 22. Each pillar 22 may be a single device active area (AA) in the later fabricating process. On one side, a plurality of trenches 24 exists around each single device AA pillar 22. A doped region 26 and a doped region 27 are disposed at the bottom and the top of each single device AA pillar 22, respectively. A shielding layer 36 is disposed between the adjacent doped regions 26. The shielding layer 36 includes conductive material. The shielding layer 36 is electrically connected to the substrate 20. Each single device AA pillar 22 can act as a vertical transistor after completing the fabricating process, wherein the doped region 26 and the doped region 27 may respectively be the source and the drain of the vertical transistor, or vice versa. Furthermore, the semiconductor device 10 may further include a plurality of bit lines 30 each connecting a plurality of doped regions 26, a plurality of word lines 32 (i.e. the gates of the vertical transistors), and a plurality of capacitors (not shown) each electrically connecting to each pillar 22 such that the semiconductor device 10 forms a dynamic random access memory (DRAM) array.

In the following paragraphs, the method for fabricating a semiconductor device of the present invention will be described by referring to the sectional views illustrating the fabricating process. Further, the present invention will be described by mainly referring to the sectional views taken along a certain direction, specifically, along the line II-II in FIG. 1.

FIGS. 2A to 2D are sectional views illustrating the fabrication process of a semiconductor device according to an embodiment of the present invention.

Figure 2A:
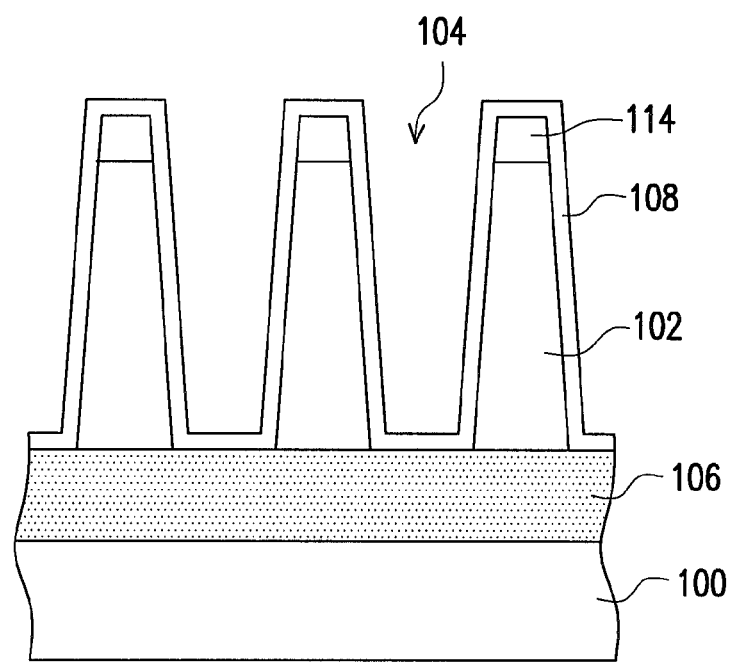
FIGS. 2A to 2D are sectional views illustrating a fabrication process of a semiconductor device according to an embodiment of the present invention.

Referring to FIG. 2A, a method for fabricating a semiconductor device includes the following steps. First, a substrate 100 such as a silicon substrate is provided. A cap 114 may be disposed at the top of each pillar 102. The material of the cap 114 is different from that of the pillar 102. The cap 114 may include, for example, silicon oxide or silicon nitride. The pillars 102 may be formed by the following steps, but the present invention is not limited thereto. First, a cap material is formed on the substrate 100. Then, the cap material and substrate 100 are patterned by photolithography. An etching process is carried out so as to form the trenches 104. The long AA pillars 102 are formed as a result of this etch, and cap 114 remains on each of the long AA pillar as shown in FIG. 2A.

A liner 108 is formed on the sidewall of each long AA pillar 102 and the top and sidewall of each cap 114. The liner 108 includes, for example, oxide, nitride, or a combination thereof. The liner 108 may be formed by, for example, chemical vapor deposition (CVD).

Next, an ion implantation process is performed to implant dopants into the bottom of each trench 104 through the liner 108. A thermal drive-in process is subsequently performed such that the dopants diffuse to a region below each long AA pillar to form the continuous doped region 106. The conductivity type of the doped region 106 may be opposite to that of the substrate 100. For example, if the substrate 100 is a p-type substrate, the doped region 106 may be formed by doping n-type dopants; if the substrate 100 is a n-type substrate, the doped region 106 may be formed by doping p-type dopants.

Figure 2B:
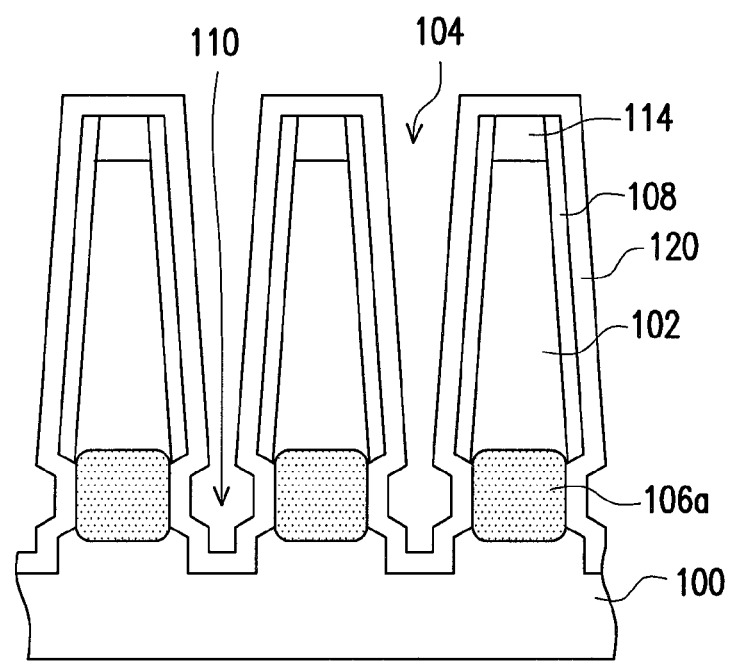

Referring to FIG. 2B, a combination of anisotropic and isotropic etch is used so that the liner 108 and a portion of the substrate 100 at the bottom of each trench 104 are removed to form an opening 110 between the bottom portions of adjacent long AA pillars 102, and thus the doped regions 106a below the adjacent long AA pillars 102 are separated from each other.

A spacer material 120 may be formed on the surface of each pillar 102, the sidewall of each doped region 106a, and the surface of the substrate 100. The spacer material 120 may be different from the material of the liner 108. For example, the spacer material 120 may includes oxide, nitride, or a combination thereof, and the spacer material 120 may be formed by CVD.

Figure 2C:
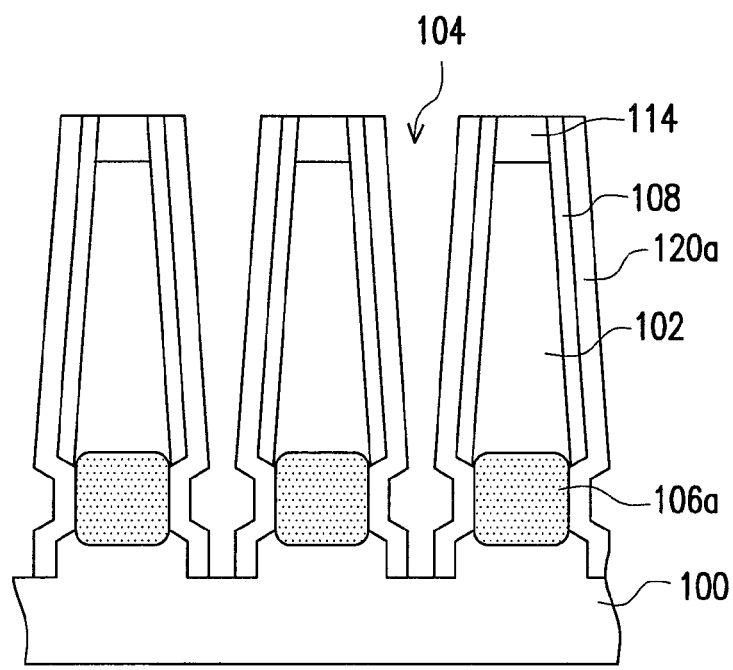

Referring to FIG. 2C, a portion of the spacer material 120 may be removed to form a plurality of spacers 120a. The spacers 120a expose the surface of the substrate 100 at the bottom of each opening 110. The spacer material 120 may be removed by, for example, an anisotropic etching process such as a dry etching process.

Figure 2D:
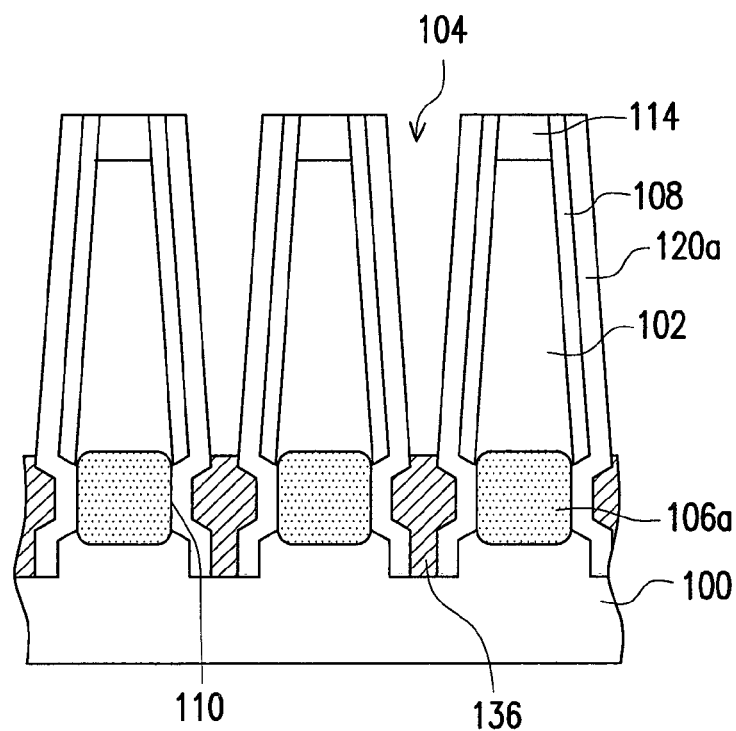

Referring to FIG. 2D, a shielding layer 136 is formed in each opening 110 between the doped regions 106a. The shielding layer 136 is electrically connected to the substrate 100. The shielding layer can be grown from bottom up using technique such as selective epitaxial silicon growth. The epitaxial silicon may be in-situ doped during growth or may be implanted later to make it conductive. The shielding layer 136 may also be formed by, for example, filling a shielding material into each opening 110 and etching back the shielding material. In this case, the shielding material may be conductive material such as doped polysilicon or metals. These shielding materials may be formed by, CVD or ALD processes. In either case, the top location of the shield material can be controlled to achieve desired coupling capacitance between different conductive regions.

In the subsequent fabrication process for a semiconductor device, each long AA pillar may be fabricated into a vertical transistor by performing patterning and etching processes in a direction substantially perpendicular to the long AA pillars. As the size of the transistor gradually decreases, the coupling effect between the adjacent doped (or conductive) regions becomes significant. According to present invention, a shielding layer is formed between adjacent doped (or conductive) regions, and thus the coupling effect between these adjacent features may be reduced, which resolves the problem of parasitic capacitance.

To sum up, according to the present invention, a shielding layer is formed between the doped (or conductive) regions and provides a shielding effect. The coupling effect between the adjacent doped (or conductive) regions may be reduced, resolving the problem of parasitic capacitance.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor device, comprising:
   a matrix of pillars disposed on a substrate, wherein a plurality of trenches are formed around each pillar;
   a doped region disposed in the substrate below each pillar, an opening being disposed between the adjacent pillars such that the doped regions below adjacent pillars separate from each other; and
   a shielding layer comprises conductive material disposed in each opening.

2. The semiconductor device of claim 1, wherein the conductive material comprises doped epitaxial silicon, doped polysilicon or metal.

3. The semiconductor device of claim 1, further comprising a spacer disposed on a side wall of each pillar and between the doped region and the shielding layer.

4. The semiconductor device of claim 3, further comprising a liner disposed between the side wall of each pillar and the spacer.

5. The semiconductor device of claim 1, wherein the shielding layer is electrically connected to the substrate.

\* \* \* \* \*